United States Patent [19]

Ragan

[11] Patent Number: 4,513,260
[45] Date of Patent: Apr. 23, 1985

[54] PROGRAMMABLE FREQUENCY CONVERTING FILTER

[75] Inventor: Lawrence H. Ragan, Dallas, Tex.

[73] Assignee: Texas Instruments Incorporated, Dallas, Tex.

[21] Appl. No.: 758,365

[22] Filed: Jan. 10, 1977

[51] Int. Cl.³ .................... H03H 15/02; H03H 17/06
[52] U.S. Cl. .................................. 333/165; 328/151; 333/166; 333/174
[58] Field of Search .................. 333/70 R, 70 T, 18, 333/28 R, 165, 166, 174; 307/221 D, 308, 304, 221 R, 221 C; 328/167, 151; 364/819, 824, 862

[56] References Cited
U.S. PATENT DOCUMENTS

| 3,402,355 | 9/1968 | Hannan et al. | 328/151 |
| 3,628,065 | 12/1971 | Hill | 307/208 |
| 3,691,486 | 9/1972 | Borsuk et al. | 333/70 T |
| 3,999,152 | 12/1976 | Sato et al. | 333/70 T |
| 4,001,716 | 1/1977 | Swanson et al. | 331/177 R X |
| 4,031,490 | 6/1977 | Copeland | 333/70 T |

OTHER PUBLICATIONS

Tompsett et al.–"Use of Charge–Coupled Devices for Delaying Analog Signals", IEEE Journal of Solid-State Circuits, Apr. 1973; pp. 151–157.
Smith et al.–"Active Band Pass Filtering with Bucket–Brigade Delay Lines", IEEE Journal of Solid State Circuits, Oct. 1972; pp. 421–425.
Puckette et al.–"Bucket Brigade Transversal Filters" in IEEE Trans. on Circuits and Systems, vol. CAS-21, No. 4, Jul. 1974; pp. 502–510.

Primary Examiner—Marvin L. Nussbaum
Attorney, Agent, or Firm—William E. Hiller; James T. Comfort; Melvin Sharp

[57] ABSTRACT

Disclosed is a programmable frequency converting filter having a plurality of selectable operating modes, and having frequency passbands of a unique width for each of the operating modes. The programmable frequency converting filter is comprised of a charge transfer device transversal filter, a non-sampling filter, and a frequency band selector. The transversal filter has an output lead coupled to an input of the non-sampling filter, and has clock leads coupled to the output of the frequency band selector. The frequency band selector has control leads for receiving logic signals which together select operating modes from the plurality of modes. The frequency band selector generates, on the clock leads, clocking signals having a unique frequency for each mode of the plurality.

12 Claims, 37 Drawing Figures

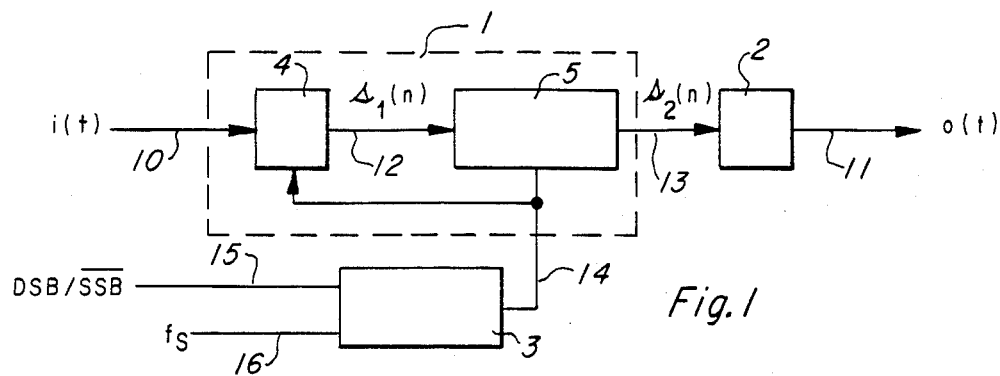
Fig.1
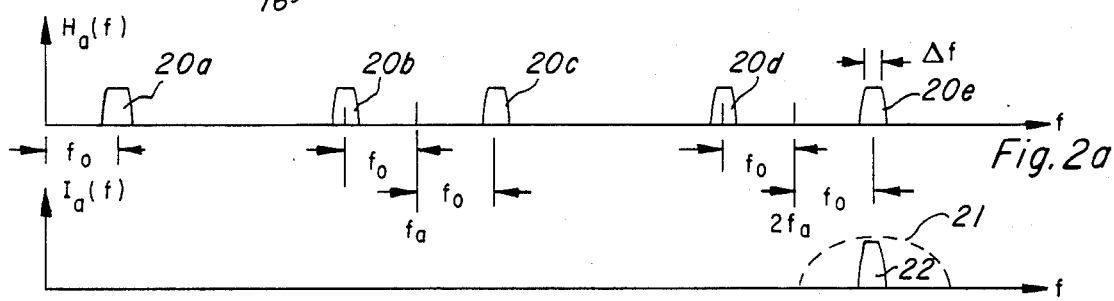
Fig.2a
Fig.2b
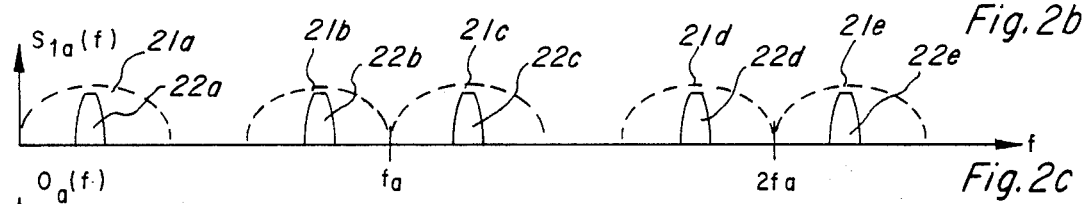
Fig.2c
Fig.2d
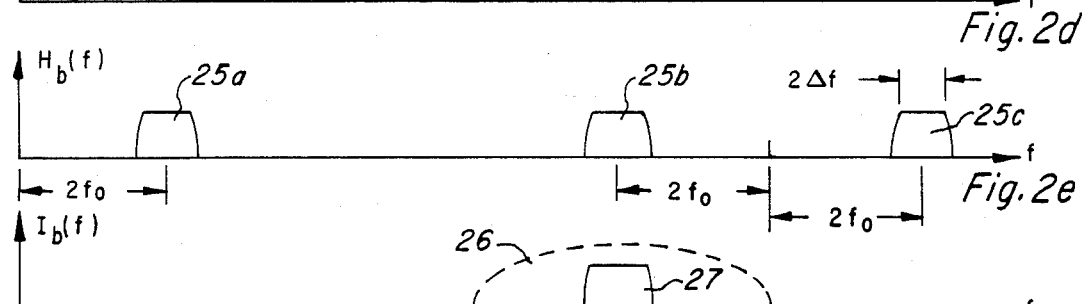
Fig.2e
Fig.2f
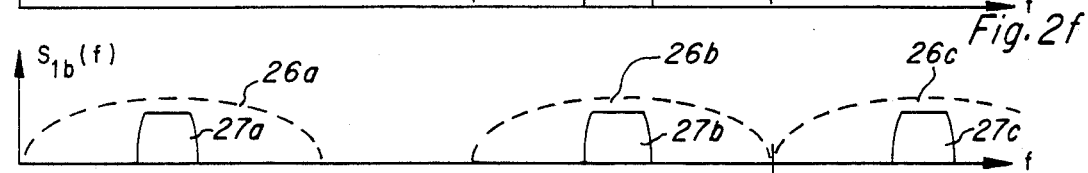
Fig.2g
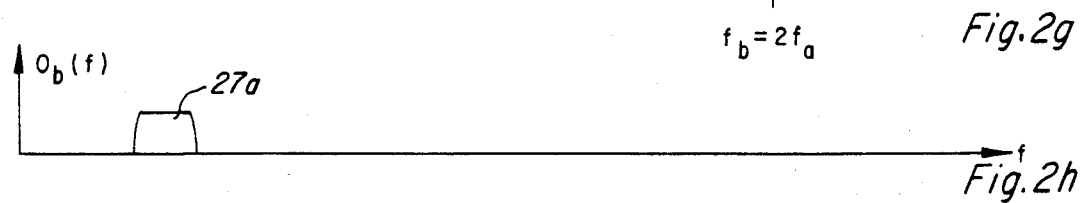
Fig.2h

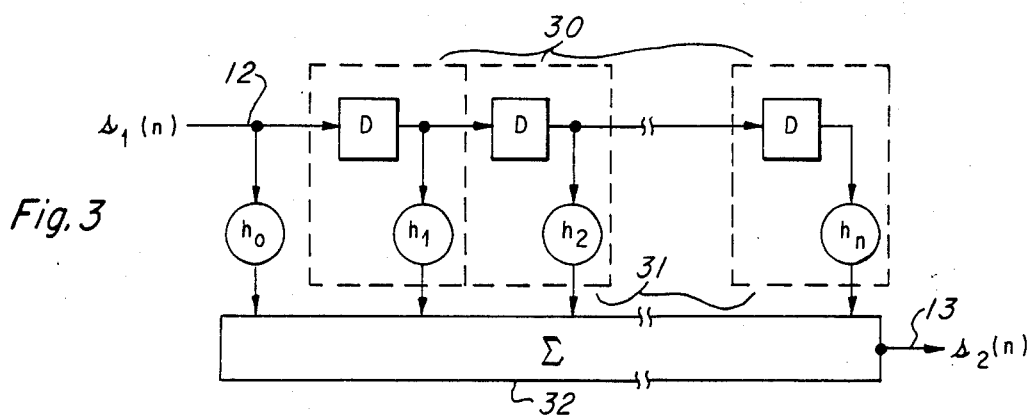
Fig. 3
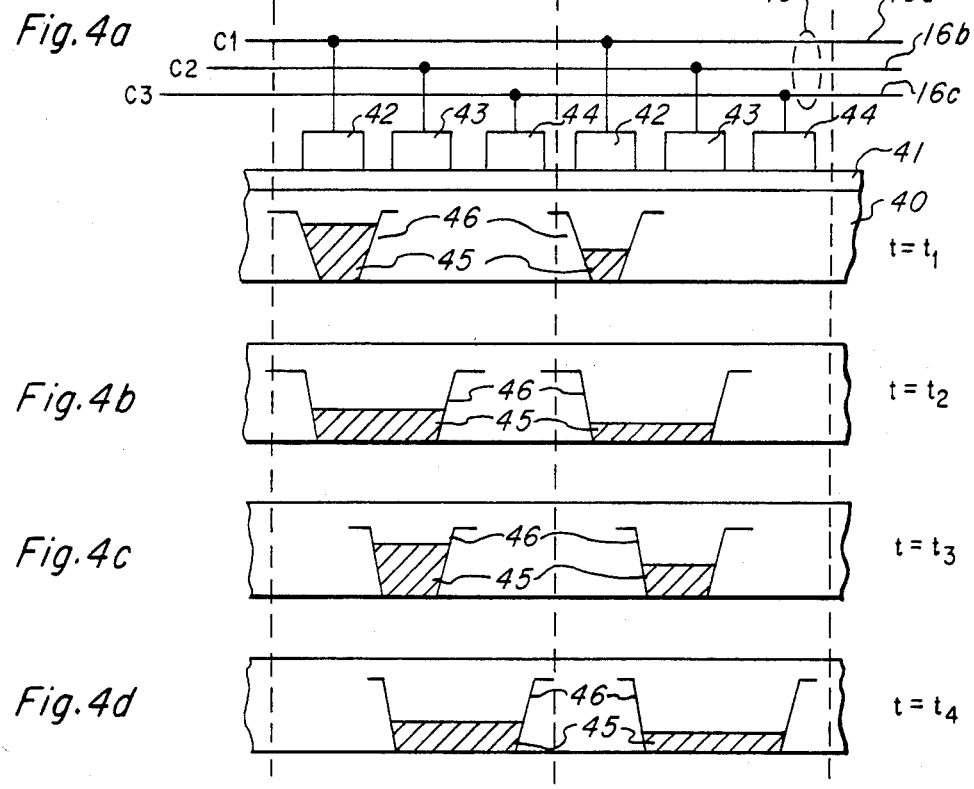
Fig. 4a
Fig. 4b
Fig. 4c
Fig. 4d
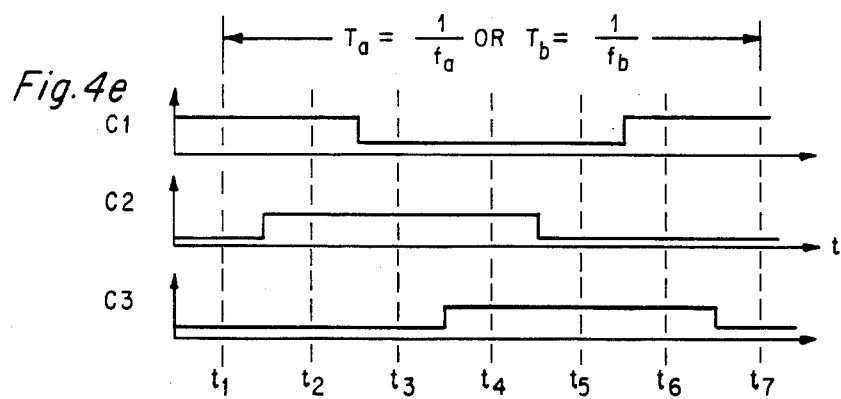
Fig. 4e

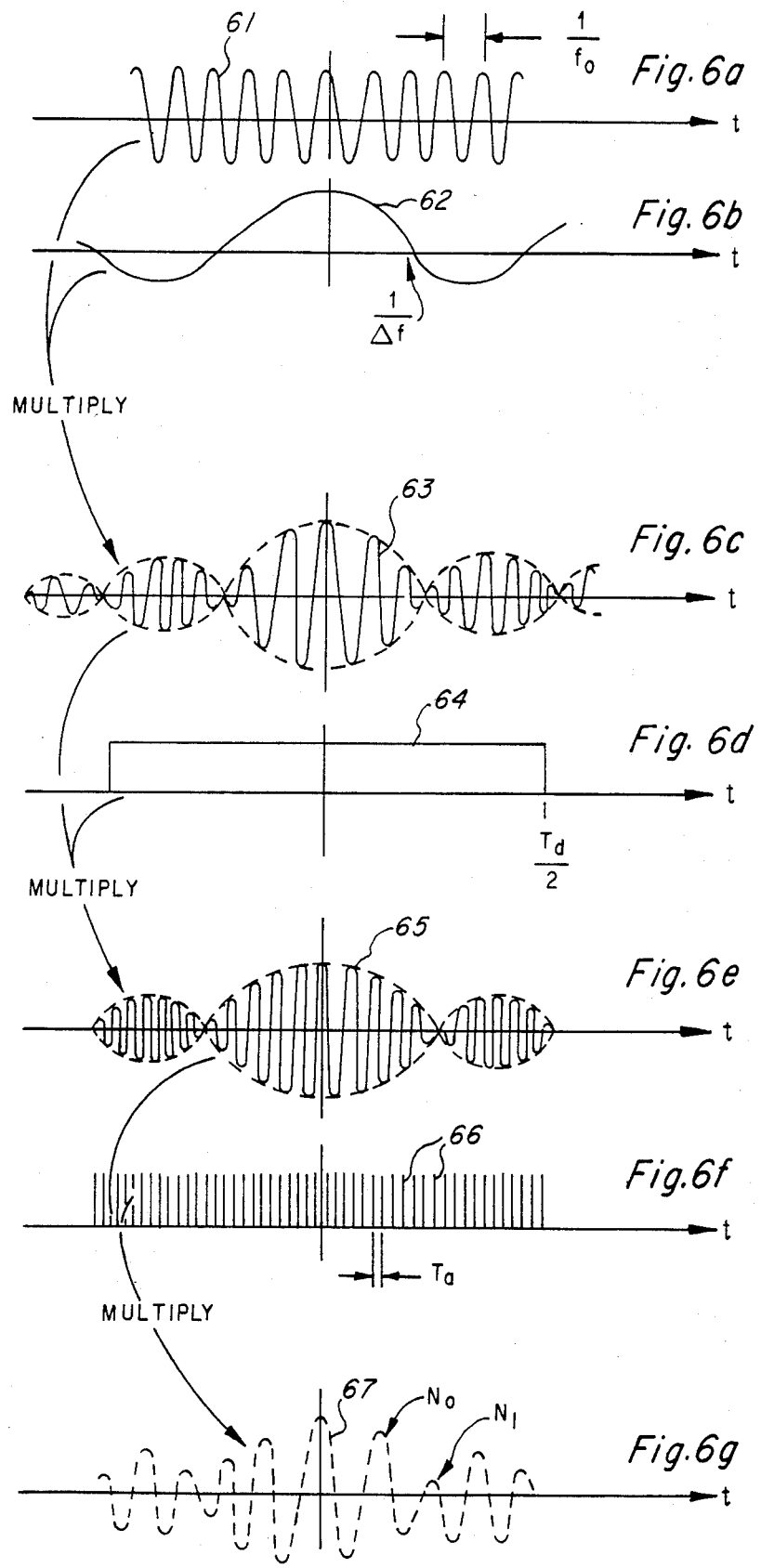

*Fig. 7a*
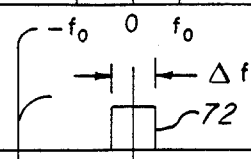
*Fig. 7b*
CONVOLVE
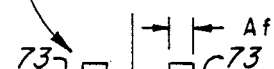
*Fig. 7c*
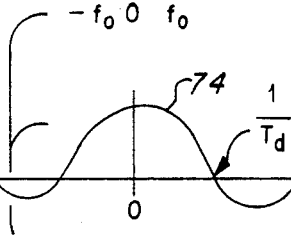
*Fig. 7d*
CONVOLVE
*Fig. 7e*
CONVOLVE
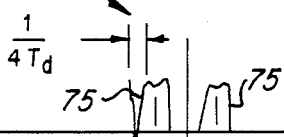
*Fig. 7f*
CONVOLVE
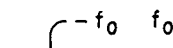
*Fig. 7g*

PROGRAMMABLE FREQUENCY CONVERTING FILTER

BACKGROUND OF THE INVENTION

This invention relates to analog signal processing devices, and more particularly to electronic filtering and mixing devices. Filtering devices receive electronic input signals containing a plurality of frequencies, including a desired channel (or frequency spectrum); and pass only signals within the desired channel. Mixing devices receive input signals and generate output signals having frequency spectrums proportional to the spectrum of the input signal and centered about new frequencies.

The invention herein described is called a programable frequency converting filter because it performs both filtering and mixing operations; and in addition, the width of the channel that is passed is not fixed but is logically selectable. As an example, at one time instant, the programmable frequency converting filter may pass a band of frequencies corresponding to one single side band channel, and center this channel about new frequencies. Alternatively, at another time instant, the programmable frequency converting filter may pass a band of frequencies corresponding to one double side band channel, and center this channel about other new frequencies.

Applications for the programmable frequency converting filter are very broad. Typical uses include the processing of signals in radio receivers, television receivers, and CB transceivers. In the past, these devices required on circuit to filter single sideband channels and another circuit to filter double sideband channels. In comparison, the present invention selectively filters single sideband channels or double sideband channels with only one circuit.

Also, in the past, the filtering operation was performed by electronic circuits which were both expensive and too large to integrate by a semiconductor chip. This was because the narrow spacing between adjacent channels in the frequency spectrum requires the filter to have an abrupt transition from its passband to its stopband. The width of this transition is generally referred to as the skirt response of the filter. In order to achieve a narrow skirt response either multipole mechanical filters, lumped inductor-capacitor elements, or multipole crystal filters were required.

In comparison, the present invention utilizes a charge transfer device configured as a transversal filter to achieve the sharp skirt response. The charge transfer device may be a charge coupled device (CCD) or a bucket brigade device (BBD) as an example. The charge transfer device is both inexpensive and capable of being integrated on a single semiconductor chip.

In addition, the mixing operation or frequency converting operation was performed in the past by an oscillator circuit and a mixer circuit which were separate from the filter circuit. In comparison, the present invention performs frequency conversion by a charge injection sampling device which is an integral part of the tranversal filter. By taking periodic samples of the input signals, the sampling device creates new signals having frequency spectrums proportional to the input signals and being spaced about multiples of the sampling frequency. These new signals are then passed through the filter portion of the charge transfer device. The filter portion has multiple passbands each of which is proportional to the sampling frequency and centered about multiples of the sampling frequency. Thus, it passes the desired channel at multiples of the sampling frequency. A continuous filter having a single passband couples to the output of the transversal filter. This single passband is aligned with one of the multiple passbands of the transversal filter.

Still another important aspect of this invention is that the skirt response of the continuous filter need not be abrupt. This is because the sampling frequency of the transversal filter is high, and thus, the spacing between its multiple passbands is large. Therefore, the continuous filter doesn't require multipole mechanical elements or crystals, and is capable of being integrated on a semiconductor chip along with the transversal filter.

Accordingly, it is one object of the invention to provide an improved device for filtering electronic signals and for frequency shifting the filtered channel.

It is another object of the invention to provide a frequency converting filter having passbands of a programmable width.

Another object of the invention is to provide a programmable frequency converting filter having an abrupt transition from stopband to passband.

Still another object of the invention is to provide a programmable frequency converting filter that is capable of being integrated on a single semiconductor chip.

SUMMARY OF THE INVENTION

These and other objectives are accomplished in accordance with the invention via a programmable frequency converting filter having frequency passbands of a unique width for each of the operating modes. The programmable frequency converting filter is comprised of a charge transfer device transversal filter, a non-sampling filter, and a frequency band selector. The transversal filter has an output lead coupled to an input on the non-sampling filter, and has clock leads coupled to outputs on the frequency band selector. The frequency band selector has control leads for receiving logic signals which together select operating modes from the plurality of modes. The frequency band selector generates, on the clock leads, clock signals having the unique frequency for each mode of the plurality. The charge transfer device transversal filter has a frequency response consisting of a plurality of passbands each having a width proportional to the clock signal frequency, and they are centered about multiples of the clock signal frequency.

BRIEF DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings, wherein:

FIG. 1 is a block diagram of the programmable frequency converting filter;

FIGS. 2a–2d are frequency spectrums of signals appearing at selected points within the programmable frequency converting filter of FIG. 1 when operated in the single side band mode;

FIGS. 2e–2h are frequency spectrums of signals appearing at selected points within the programmable frequency converting filter of FIG. 1 when operated in the double side band mode;

FIG. 3 is a block diagram of a charge transfer device arranged as a transversal filter;

FIGS. 4a–4d are greatly enlarged cross-sectional views of two adjacent stages within the transversal filter of FIG. 3;

FIG. 4e is a timing diagram illustrating a clock sequence for moving charge within the transversal filter of FIG. 3;

FIGS. 6a–6g are timing diagrams of impulse responses which are combined to define the position of the slits of the split electrodes illustrated in FIG. 5;

FIGS. 7a–7g are frequency spectrums of the impulse responses illustrated in FIGS. 6a–6g;

FIGS. 9b–9d are surface potential diagrams taken at various instants in time for the charge injection sampling device of FIG. 9a;

DETAILED DESCRIPTION

Figure 5:
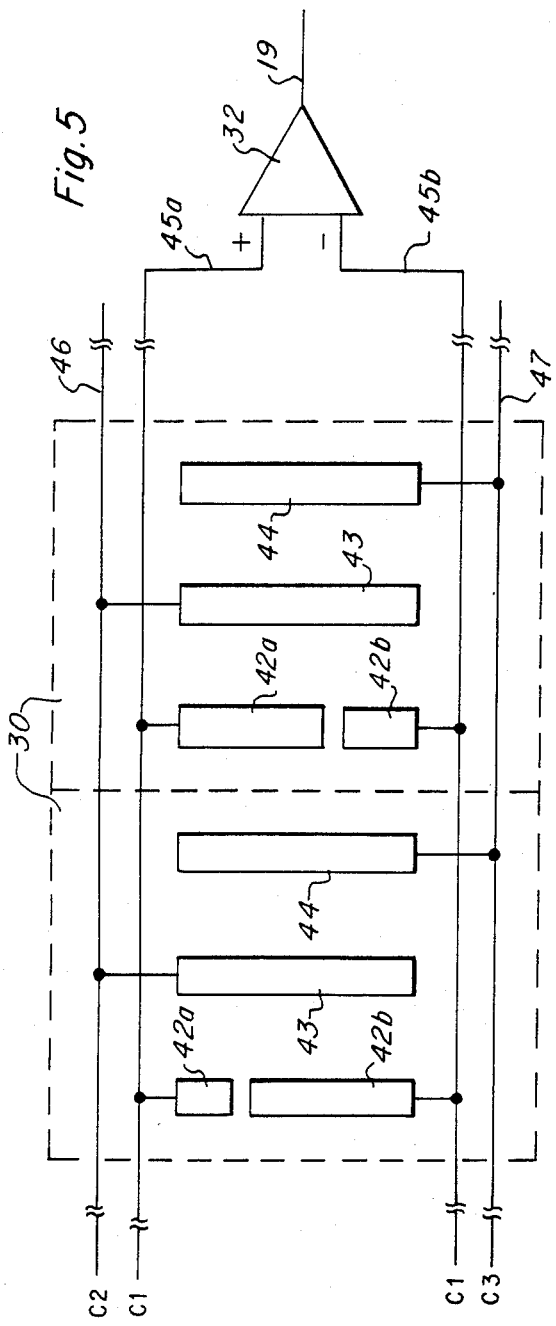
FIG. 5 is a schematic diagram of two adjacent stages of a split electrode charge transfer device.

Referring to FIG. 1 a programmable frequency converting filter, which is constructed according to the invention is illustrated in block diagram form. The programmable frequency converting filter is comprised basically of a charge transfer device transferred filter 1, a continuous filter (or non-sampling filter) 2, and a frequency band selector 3. Frequency band selector 3 has two input leads 15 and 16. A clock signal of fixed frequency $f_s$ is applied to lead 16. A logic signal $\overline{DSB}\overline{SSB}$ is applied to lead 15. Signal $\overline{DSB}\overline{SSB}$ has two logic states, a one state and a zero state. When the $\overline{DSB}\overline{SSB}$ signal is in a one state, the programmable frequency converting filter passes a band of frequencies corresponding to one double side band (DSB) channel. This is called the DSB mode of operation. Conversely when the $\overline{DSB}\overline{SSB}$ signal is in a zero state, the programmable frequency converting filter passes frequencies corresponding to one single side band (SSB) channel. This is called the SSB mode of operation.

Transversal filter 1 is comprised of a charge injection sampling device 4 and a sampled data transfer function generator 5. An input lead 10 couples to the input of charge injection sampling device 4. Electrical signals i(t) are applied to lead 10 and are filtered by the programmable frequency converting filter in accordance with the $\overline{DSB}\overline{SSB}$ signal applied to lead 15. Charge injection sampling device 4 generates signals $s_1(n)$ by sampling signals i(t). A lead 12 couples signals $s_1(n)$ to sampled data transfer function generator 5. In response, generator 5 generates new signals $s_2(n)$ on a lead 13. The manner in which signals $s_1(n)$ and signals $s_2(n)$ are generated is dependent upon clocking signals received by transversal filter 1 on leads 14. Leads 14 couple to outputs on frequency band selector 3. The clocking signals on leads 14 are generated by frequency band selector 3 in response to the $\overline{DSB}\overline{SSB}$ signal on lead 15. To complete the structure, a lead 13 couples to an input on the non-sampling filter 2, and a lead 11 couples to the output of the non-sampling filter 2. Output signals o(f) from the programmable frequency converting filter are generated on lead 11.

The functional operation of the programmable frequency converting filter is illustrated in FIGS. 2a through 2h. In particular FIGS. 2a through 2d illustrate the SSB mode of operation; and FIGS. 2e through 2h illustrate the DSB mode of operation. Referring now to FIG. 2a, the frequency response of sampled data transfer function generator 5 is illustrated for the SSB mode of operation. In this mode of operation, the frequency response of sampled data transfer function generator 5 consists of a plurality of pass bands 20a, 20b . . . each of width $\Delta f$. These pass bands are centered about the frequencies $n \times f_a \pm f_0$. This frequency response is termed $H_a(f)$.

In comparison FIG. 2e illustrates the frequency response of sampled data transfer function generator 5 when it is operated in the DSB mode. In this mode, the frequency response consists of a plurality of pass bands 25a, 25b . . . each of width $2\Delta f$. The pass bands of width $2\Delta f$ are centered about the frequencies of $n \times f_b \pm f_0$. (That is, the width of the pass bands of sample data transfer function generator 5 is $\Delta f$ or $2 \times \Delta f$ dependent upon the mode of operation.) This response is termed $H_b(f)$.

FIG. 2b illustrates the frequency spectrum $I_a(f)$ of input signals i(t) which are received on lead 10 when the programmable frequency converting filter operates in the SSB mode. Frequency spectrum $I_a(f)$ consists of a band of frequencies 21. A single side band channel 22 lies within the band of frequencies 21. In addition, single side band channel 22 contains only frequencies which lie within one of the multiple pass bands 20a, 20b . . . of sampled data transfer function generator 5. The alignment of single side band channel 22 with one of these pass bands may be performed by a mixing operation using circuitry which is well known to those having ordinary skill in the art.

Charge injection sampling device 4 receives the band of frequencies 21 on lead 10 and samples them at a rate $f_a$ as determined by frequency band selector 3. This sampling action generates a new signal $s_{1a}(n)$ having a frequency spectrum $S_{1a}(f)$ as illustrated in FIG. 2c. Frequency spectrum $S_{1a}(f)$ consists of a plurality of frequency bands 21a, 21b, 21c, . . . each of which is proportional to frequency band 21.

The plurality of frequency bands 21a, 21b, 21c, . . . are centered about multiples of the frequency $f_a$. Therefore single side band channel 22, which lies within the band of frequencies 21, is reflected in a plurality of single side band channels 22a, 22b, 22c . . . lying respectively within the band of frequencies 21a, 21b, 21c . . . . In addition, the single side band channels 22a, 22b, 22c . . . are respectively aligned with pass bands 20a, 20b, 20c . . . of sample data transfer function generator 5. Therefore the output signal of sample data transfer function generator contains only the plurality of single side band channels 22a, 22b, 22c . . . .

The continuous filter 2 has only a single pass band, and it is designed to select only one of the multiple single side band channels contained within signal $s_{2a}(n)$. FIG. 2d illustrates the frequency spectrum $O_a(f)$ of the signal $o_a(t)$ for the case where continuous filter 2 is a low pass filter as an example.

The general operation of the programmable frequency converting filter when operated in the DSB mode is similar to the above described operation of the SSB mode. In the DSB mode, input signal i(t) has a frequency spectrum $I_b(f)$ consisting of a band of frequencies 26. The band of frequencies 26 contains a double side band channel 27. Double side band channel 27 has a width which is twice the width of single side band channel 22. FIG. 2f illustrates the frequency spectrum $I_b(f)$ of signal i(t). As an example, spectrum $I_b(f)$ may be an amplitude modulated signal with its carrier included or suppressed.

Double side band channel 27 is aligned with one of the multiple pass bands 25a, 25b, 25c . . . of sample data transfer functioning generator 5. Each of these passbands has a width of $2 \times \Delta f$. Charge injection sampling device 4 receives signal $I_b(f)$ on lead 10 and samples it at a rate $f_b$ as determined by frequency band selector 3. This sampling action generates a new signal $S_{1b}(n)$ having a frequency spectrum $s_{1b}(f)$ as illustrated in FIG. 2g.

As there illustrated, frequency spectrum $S_{1b}(f)$ includes a plurality of DSB channels 27a, 27b, 27c . . . . The multiple passbands 25a, 25b, 25c . . . of the sample data transfer function generator 5 align respectively to the DSB channels 27a, 27b, 27c. . . . Thus, sampled data transfer function generator 5 generates a signal on lead 13 being comprised of the multiple DSB channels.

The continuous filter 2 has a single passband which includes only one of these multiple DSB channels. FIG. 2h illustrates the frequency spectrum of signal $O_b(f)$ for the case where continuous filter 2 is a low pass filter.

From the description to this point it will be clear, to one having ordinary skill in the art, how the programmable frequency converting filter is to be used. What remains to be described is the construction of the components used therein. Therefore the remaining portions of this description describes the construction of sampled data transfer functioning generator 5, charge injection sampling device 4, frequency band selector 3, and continuous filter 2.

Referring to FIG. 3, a schematic diagram of transfer function generator 5 is illustrated. Transfer function generator 5 is comprised basically, of a serial array of N analog voltage delay stages 30. The first stage receives signal $s_1(n)$ on lead 12. Each stage feeds the next stage in series, and each stage also has a weighted output lead 31. The weights are serially designated $h_1, h_1, h_2, \ldots$. Lead 31 connects to a summer 32. The output of summer 32 is signal $s_2(n)$ on lead 13.

The impulse response h(n) of transfer function generator 5 is easily derived by applying an impulse to lead 12, and by calculating the resulting signal on lead 13. If $s_1(o)=1$ and $s_1(n)=0$ for $n \neq o$ then it is apparent that h(n) equals $h_0, h_1, h_2 \ldots$ for $n=o, 1, 2 \ldots N-1$.

By appropriately chosing the values $h_0, h_1, h_2, \ldots$, the previously desired frequency transfer functions $H_a(f)$ and $H_b(f)$ are obtained. Before describing the specific values of $h_0, h_1, h_2, \ldots$ which yield $H_a(f)$ and $H_b(f)$, further discussion of how to construct the analog delay stages 30, and how to construct the weighted output leads 31 is in order.

To this end, FIGS. 4a–4d illustrate cross-sectional views of one type of charge transfer device known as a 3-phase n-channel charge coupled device. In particular, FIG. 4a illustrates a cross-sectional view of two adjacent analog delay stages within this CCD. Basically, the stages 30 share a common semiconductor substrate 40 having a common insulating layer 41. Each stage has a set of three electrodes 42, 43, 44 disposed on layer 41.

Three common clock leads 16a, 16b, 16c interconnect the three electrodes of each stage.

A signal within each stage is carried by packets of minority charge carriers 45 within substrate 40. These packets 45 are trapped by potential wells 46 within each stage. The potential wells 46 are selectively formed under electrodes 42, 43, or 44 by applying a voltage of proper polarity to leads 16a, 16b, 16c respectively. The proper polarity is one which will repel the majority charge carriers in substrate 40. For example, if substrate 40 is p-type silicon, the majority charge carriers are holes, and thus a potential well is formed by applying a positive voltage to leads 16a, 16b, 16c.

The charge packets 45 are moved from stage to stage by properly sequencing the voltage on leads 16a, 16b, 16c. FIG. 4e illustrates one acceptable clock sequence. At a time $t_1$, clock C1 on lead 16a is at a high voltage while clock C2 on lead 16b and clock C3 on lead 16c are near ground. Thus, a potential well is formed only under electrodes 16a of each stage as illustrated in FIG. 4a. At a time $t_2$, clocks C1 and C2 both are at a high voltage while clock C3 remains at ground. Thus a potential well is formed under electrodes 42 and 43. The charge packets 45 are then distributed under these electrodes, as illustrated in FIG. 4b. At a time $t_3$, clock C2 has a high voltage while clocks C1 and C3 are at ground. Thus a potential well is formed only under electrodes 43; and charge packets 45 exist only under electrodes 43 as, illustrated in FIG. 4. The clocks can continue to sequence as indicated at time instants $t_1$–$t_7$. This sequence will move the charge packet under electrode 42 of one stage to a potential well 46 under electrode 42 of the adjacent stage. The time interval in which sequence $t_1$–$t_7$ occurs is the time delay of each stage-which may be varied to equal $T_a$ or $T_b$.

Referring to FIG. 5, one implementation of weighted output leads 31 and summer 32 is illustrated. This implementation is called a split electrode CCD. In the split electrode CCD, one electrode of each stage 30 is split into two partial electrodes. FIG. 5 illustrates a schematic top view of a CCD in which electrode 42 is split into partial electrodes 42a and 42b.

The principle of operation of the split electrode CCD is that as charge packets 45 transfer within substrate 40 under an electrode, a proportional but opposite charge must flow into the electrode from the clock line. Since the charge packets 45 are nearly evenly distributed under electrodes 42, the amount of charge which flows into each partial electrode 42a and 42b is proportional to its area.

Positive and negative weights are obtained by letting the charge in partial electrode 42a represent a positive value, by letting the charge in partial electrode 42b represent a negative value, and by adding the two values by summer 32. For example, to obtain a weighted output $h_m$ on the $m^{th}$ stage having a value of $h_m=+1$, the split in the $m^{th}$ stage should occur so all the charge flows into partial electrode 42a. To obtain a value of $h_m=-1$, the split in the $m^{th}$ stage should occur so all the charge flows into partial electrode 42b. And to obtain a value of $h_m=0$, the split in the $m^{th}$ stage should occur so an equal amount of charge flows into partial electrodes 42a and 42b. Values of $h_m$ between $+1$ and $-1$ are limited only by the accuracy of placement of the split.

Referring now to FIGS. 6a through 6g and FIGS. 7a through 7g, the specific values of $h_0, h_1, h_2 \ldots$ which yield the desired transfer functions $H_a(f)$ and $H_b(f)$ will be described. To begin it should be recalled that the frequency response of a device is equal to the Fourier Transform of the impulse response of the device. Therefore, a device having an impulse response 61 of COS ($2f_o t$) as illustrated in FIG. 6a, has a frequency response 71 of $+f_o$ and $-f_o$ as illustrated in FIG. 7a. Similarly, a device having an impulse response 62 of the form (Sin X)/X, as illustrated in FIG. 6b, has a frequency response 72 of an ideal low pass filter as illustrated in FIG. 7b. That is, frequency response 72 has the shape of a single pulse of width $\Delta f$ centered about the zero frequency. The term $1/\Delta f$ is the time at which the first zero crossing of the (Sin X)/X impulse response occurs.

The second principle that needs to be recalled is that multiplication in the time domain is equivalent to convolution in the frequency domain. FIG. 6c illustrates an impulse response 63 which equals the product of the impulse responses 61 and 62. Therefore, the frequency response of the device having impulse response 63 is obtained by convolving frequency response 71 with frequency response 72. The result of this convolution step yields a frequency response 73, as illustrated in FIG. 7c. As therein illustrated, frequency response 73 of two pass bands, both of width $\Delta f$, is centered about the frequencies $\pm f_o$.

Next, impulse response 63 is multiplied by another impulse response 64. FIG. 6d illustrates impulse response 64 and, as therein illustrated, it consists of a single pulse which lasts from minus $T_d/2$ to plus $T_d/2$. The multiplication of impulse response 63 with impulse response 64 yields a new impulse response 65, which is illustrated in FIG. 6e. As therein illustrated, response 65 is a truncated version of response 63.

The frequency response of a device having the truncated impulse response 65 is obtained by convolving frequency response 73 with frequency response 74—which is the Fourier transform of impulse response 64. The result of this convolution step yields a frequency response 75 as illustrated in FIG. 7e. Frequency response 75 has two pass bands of width $\Delta f$ centered about frequencies $\pm f_o$. In addition, the transition from the pass band to the stop band frequency is not instantaneous, but has a width. The width of this transition is generally referred to as skirt response, and it is approximately equal to one over four times $T_d$. Thus, the width of the skirt response decreases as the width of impulse response 64 increases.

Impulse response 65 is then multiplied by still another impulse response 66. FIG. 6f illustrates impulse response 66, which is that of an ideal sampler. That is, it consists of a series of unit impulses which are spaced apart from each other by a time delay of $T_a$. A frequency response 76, corresponding to impulse response 66, is illustrated in FIG. 7f. It consists of the set of frequencies $0, \pm(1/T_a), \pm(2/T_a) \ldots$ The term $(1/T_a)$ equals a sampling frequency $f_a$.

Convolving frequency response 76 with frequency response 75 yields frequency response 77, as illustrated in FIG. 7g. Response 77 consists of a series of passbands, each of width $\Delta f$. These passbands are centered about frequencies $nf_a \pm f_o$. Each passband also has a skirt response of approximately $\frac{1}{4}T_d$. Thus, this frequency response approximates the desired frequency response $H_a(f)$ which was previously described in conjunction with the FIG. 2a.

An impulse response which yields frequency response 77 is obtained by multiplying impulse response 65 with impulse response 66. This yields an impulse response 67 as illustrated in FIG. 6g. Response 67 has the general form of [sin x/x] [cos $2\pi f_o t$] times a truncating function and times a sampling function. This impulse response is implemented by transfer function generator 14.

This analysis therefore describes how the splits in electrodes 42a and 42b should be arranged to obtain frequency response $H_a(f)$. To summarize, these splits will have the profile of (sin x/x) times cos ($2\pi f_o t$). The frequency $f_o$ equals $1/(T_a N_o)$ where $1/T_a$ is the sampling rate, and $N_o$ is the number of stages 30 over which the term $\cos(2\pi f_o t)$ completes one cycle. Similarly, the bandwidth $\Delta f$ of each passband equals $1/(T_a N_1)$ where $1/T_a$ equals the same sampling rate, and $N_1$ equals the number of stages in which the (sin x)/x function passes before reaching its first zero crossing. The terms $N_o$ and $N_1$ are illustrated in FIG. 6g. The skirt response equals approximately $1/(4T_d)$, where $T_d$ equals the total number of stages in the transversal filter times the sampling time $T_a$.

In addition, the analysis implies how frequency response $H_b(f)$ is obtained. Frequency response $H_b(f)$ has multiple passbands, each of width $2\Delta f$, and centered about the frequencies $n \times f_b \pm 2f_o$ where $f_b = 2f_a$. Such a frequency response is obtained from a charge transfer device transversal filter having multiple passbands, each of width $\Delta f$, and centered about the frequencies $n \times f_a \pm f_o$ (as described above) by doubling the clocking rate of the filter. This is because the width of the passbands of the previously described charge transfer device transversal filter is proportional to its clocking rate, and the center of frequency of the passbands is also proportional to its clocking rate. Thus, by selectively applying clock signals of frequency $f_a$ or $f_b$, the charge transfer device transversal filter can be programmed to pass frequencies corresponding to one SSB channel or one DSB channel. Frequency band selector 3 generates clock signals $f_a$ or $f_b$ on leads 14 in response to the DSB/$\overline{SSB}$ signal.

Figure 8:
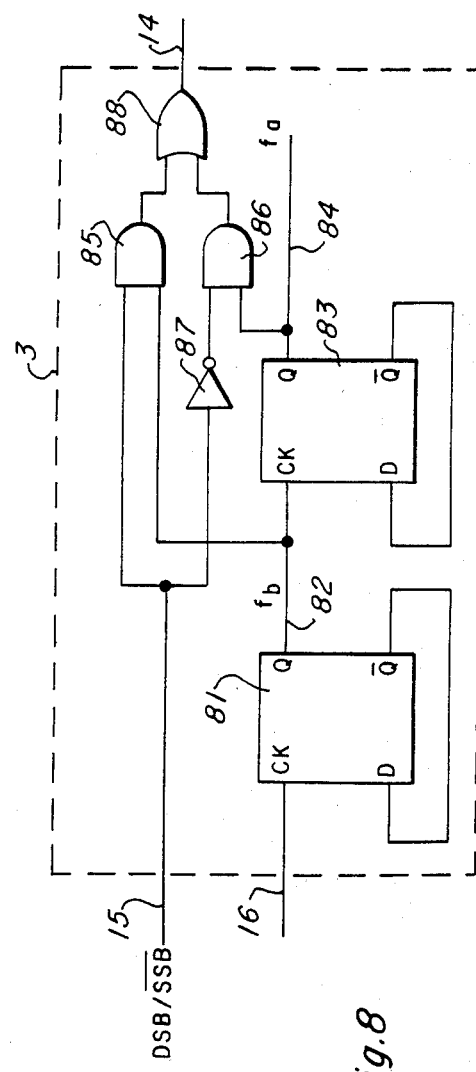
FIG. 8 is a logic diagram of the frequency band selector of FIG. 1.

Referring now to FIG. 8, a logic diagram of frequency band selector 3 is illustrated. Lead 16 couples to the input of a counting circuit 81. Counting circuit 81 divides the clock signal on leads 16 to generate a new clock signal of frequency $f_b$ on a lead 82. As illustrated in FIG. 8, counting circuit 81 is drawn as a triggerable flip-flop. However, many other counting circuits are also acceptable as would be obvious to a person having ordinary skill in the art.

Lead 82 couples to the input of a triggerable flip-flop 83 having an output lead 84 on which are generated clock signals of frequency $f_a$. Leads 82 and 84 couple respectively to logical AND gates 85 and 86. A second input on logical AND gate 85 couples to lead 15. Also, lead 15 couples to an inverter 87 having an output coupled to a second input on logical AND gate 86. Logical gates 85 and 86 have an output coupled to individual inputs on a logical OR gate 88. Lead 14 couples to an output on logical OR gate 88. By this configuration, clocking signals are generated on lead 14 having a frequency of $f_a$ or $f_b$ dependent upon the logical state of signal DSB/$\overline{SSB}$ on lead 15.

Figure 9A:
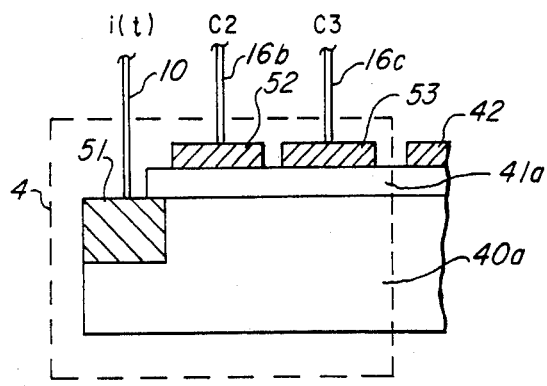
FIG. 9a is a greatly enlarged cross-sectional view of a charge injection sampling device which comprises a portion of the transversal filter of FIG. 1.

Referring now to FIGS. 9a–9d, the structure and operation of charge injection sampling device 4 will be described. FIG. 9a illustrates a greatly enlarged cross sectional view of one embodiment of the sampling device. This embodiment is formed in a portion 40a of substrate 40 which lies adjacent to the first stage of transfer function generator 5. A charge source 51 lies within this portion of the substrate. Charge source 51 consists of an ion diffusion or ion implant region. The ions comprising charge source 51 have majority charge carriers of a type opposite to those in substrate 40. Input lead 10 couples to charge source 51. A portion 41a of insulating layer 41 lies on the surface of substrate 40 above the region occupied by the charge injection sampling device 4. An electrode 53 lies on insulating layer 41a. Electrode 53 lies next to electrode 42 of the first stage 30 of transfer function generator 5, and is spaced apart from charge source 51. Lead 16c, carrying clock signal C3, couples to electrode 53. In addition, an electrode 52 lies on the surface of the insulating layer portion 41a in the space lying between electrode 53 and charge source 51. Lead 16b, carrying clock signal C2, couples to electrode 52.

Figure 9C:
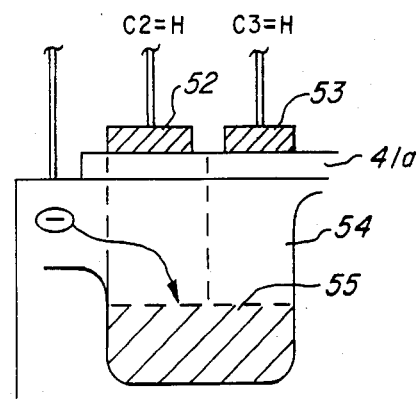
Figure 9B:
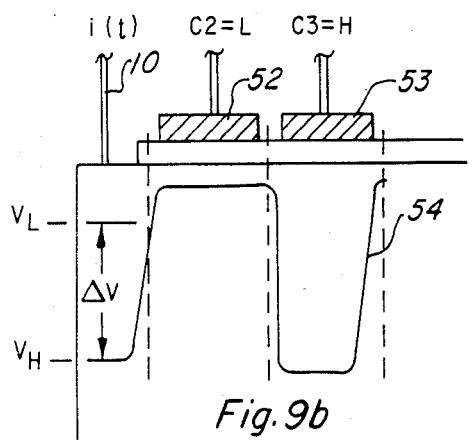
Figure 9D:
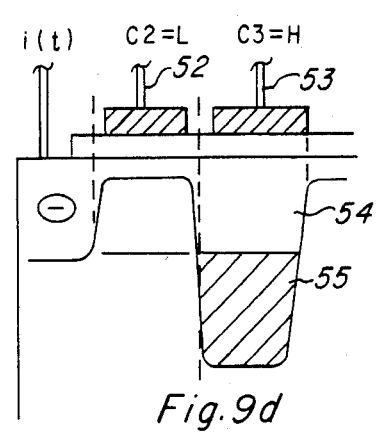

FIGS. 9b-9d illustrate the sampling action of device 4 for the case where substrate 40 is P-type, as an example. When the clock signal C2 is low and clock signal C3 is high, a potential barrier exists on the surface area of substrate 40 lying between charge source 51 and electrode 53. Thus, the input signal i(t) on lead 10 can vary between values $V_L$ and $V_H$ without injecting minority charge carriers into the potential well 54 lying under electrode 53. This is illustrated in FIG. 9b. Alternatively, when clocks C2 and C3 are both at a high voltage level, minority charge carriers are injected from charge source 51 into the potential well 54 lying under electrode 53. This forms a charge packet 55 under electrodes 52 and 53. This charge injection operation is illustrated in FIG. 9c. Subsequently, clock C2 goes to a low voltage level while clock C3 remains at a high voltage level. Thus, a potential barrier is again formed between charge source 51 and the surface area under electrode 53. This potential barrier traps charge packet 55 under electrode 53. The amount of charge in charge packet 55 is proportional to the magnitude of the input signal i(t) on lead 10 at the instant clock C2 makes the high voltage to low voltage transition. In other words, input signal i(t) is sampled on a clock edge. Thus, the sampling action of device 4 approximates that of an ideal sampler; and the charge packets 55 that are generated by this sampling action represent the signal $S_1(n)$ whose frequency spectrum was previously described in conjunction with FIG. 2c as $S_{1a}(f)$.

Figure 10A:
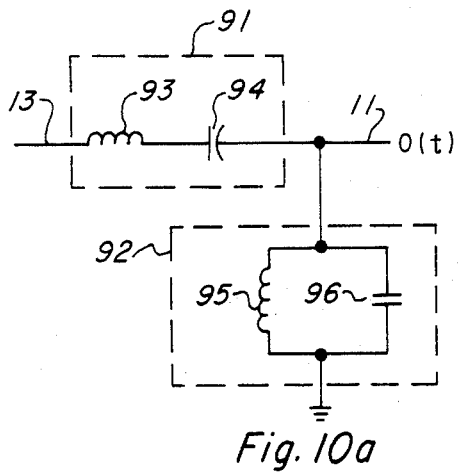
FIG. 10a is a detailed circuit diagram of one embodiment of the continuous filter of FIG. 1.

Referring now to FIG. 10a, one particular embodiment of the non-sampling filter 2 is illustrated. Non-sampling filter 2 consists of a series resonant circuit 91, having an input coupled to lead 13, and a parallel resonant circuit 92 having an input coupled to the output of series resonant circuit 91. Series resonant circuit 91 consists of an inductor 93 in series with capacitor 94. Parallel resonant circuit 92 consists of an inductor 95 in parallel with a capacitor 96. The values of inductors 93 and 95 and capacitors 94 and 96 are chosen so as to produce a single passband which coincides with one of the multiple passbands of the transversal filter 1. The method for picking specific values for circuit elements 93–96 is conventional in the art. For example, a textbook, Linear Network Design and Synthesis by W. H. Chinn, 1964 illustrates one method of synthesizing such a filter on page 330. The actual values chosen for circuit elements 93–96 will vary depending upon the width and spacing of the multiple passbands of filter 1 -one of which is to be passed by filter 2.

The non-sampling filter 2 may also take on additional forms which are modifications of that illustrated in FIG. 10a. For example, depending on the width of the passband required, either series resonant circuit 91 or parallel resonant circuit 92 may be eliminated. In addition, for many applications, filter 2 could be a simple R-C low pass circuit. Or, when synchronous detection is used with linear I.F. amplifiers, no filter at all may be necessary. Also, when the filtered signal is further coupled to an audio speaker, the speaker itself may act as the continuous filter. Conversely, additional resonant circuits 91 and 92 may be added to form multiple "T" or "$\pi$" type networks. These networks are also described in the above referenced W. H. Chinn text.

Figure 10B:
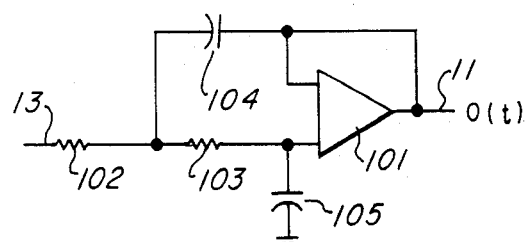
FIG. 10b is a detailed circuit diagram of another embodiment of the continuous filter of FIG. 1.

Referring now to FIG. 10b, a detailed circuit diagram of a second embodiment of the frequency converting filter is illustrated. In this embodiment the non-sampling filter 2 is an active filter. More specifically it includes a high gain DC operational amplifier 101. Signal $S_2(n)$ on lead 13 couples to the input of the operational amplifier 101 through two serially connected resistors 102 and 103. The output of operational amplifier 101 is coupled to output lead 11, and is fed back through a capacitor 104 to a node lying between resistors 102 and 103.

A second capacitor 105 couples the input of operational amplifier 101 to ground. This configuration of operational amplifier 101 in conjunction with elements 102 through 105 forms a low pass active filter. The actual values of circuit elements 102–105 may vary, and are chosen by a practice that is conventional in the art. One practice is illustrated for example in the 1976 Signetics Integrated Circuits Catalog on page 2-93.

Operational amplifiers may also be used in the non-sampling filter 2 to obtain a bandpass characteristic. In this configuration two operational amplifiers are used. One of the operational amplifiers in interconnected with resistors and capacitors as illustrated in FIG. 10b to form a low pass filter. The other operational amplifier is interconnected with resistors and capacitors to form a high pass active filter. The input of the high pass active filter couples to the output of low pass active filter, thereby producing a bandpass active filter. The high pass active filter is designed by replacing resistors 102 and 103 with capacitors, and by replacing capacitors 104 and 105 with resistors. This structure is also described in the previously referenced Signetics handbook on page 2-93.

Various specific embodiments of the programmable frequency converting filter have now been described in detail. From this description, it will be apparent that various changes and modifications may be made without departing from the nature and spirit of the invention. For example, frequency band selector 3 may include counting circuits other than the triggerable flip-flops 81 and 83 as illustrated in FIG. 8. In addition, the clocking frequencies $f_a$ and $f_b$ may be chosen to have a ratio other than 1 to 2, in which case the designations DSB and SSB (as used in this specification) may be changed to something more appropriate. Also, frequency band selector 3 may have more than two modes of operation. For example, it may receive multiple logic signals to select the desired mode of operation and in response thereto, generate multiple clocking signals on lead 14.

The charge transfer device transversal filter may also be constructed on a P-type or an N-type substrate. In addition, transversal filters having any number of clocking phases per stage are acceptable. Further, other type charge injection sampling devices may be used. Also, the non-sampling filter and the transversal filter may be integrated on the same or different semiconductor chips.

Therefore, since it is apparent that many changes and modifications can be made in the above details without departing from the nature and spirit of the invention, it is understood that the invention is not to be limited to the described details except as set forth in the appended claims.

What is claimed is:

1. A programmable frequency converting filter having a plurality of selectable operating frequency modes, said filter comprising:
 a charge transfer device transversal filter and a frequency band selector;
  said frequency band selector having
   at least one control lead for receiving a logic signal,
   logic circuitry means provided therein for selecting a frequency mode from the plurality of operable frequency modes in response to the logic signal received thereby to generate clock signals corresponding to the selected frequency mode, and
   an output clock lead on which the generated clock signals of a frequency unique to the selected mode are transmitted; and
  said transversal filter having
   inputs coupled to the output clock lead of said frequency band selector for receiving said clock signals, and
   an output providing a plurality of passbands with each passband of said plurality of passbands having a width proportional to the frequency of said clock signals.

2. A programmable frequency converting filter according to claim 1 wherein each passband of said plurality of passbands is centered about multiples of the frequency of said clock signals.

3. A programmable frequency converting filter according to claim 1 wherein said charge transfer device transversal filter is a split electrode charge coupled device transversal filter.

4. A programmable frequency converting filter according to claim 1, further including a non-sampling filter; said non-sampling filter having an input lead coupled to the output of said transversal filter, and having a single passband centered to transmit only one passband of said plurality of passbands provided from the output of said transversal filter.

5. A programmable frequency converting filter according to claim 4 wherein said non-sampling filter is a low pass filter.

6. A programmable frequency converting filter according to claim 4 wherein said non-sampling filter is a bandpass filter.

7. A programmable frequency converting filter according to claim 1 wherein, said programmable frequency converting filter is integrated on a single semiconductor chip.

8. A programmable frequency converting filter having a plurality of selectable operable frequency modes, said filter comprising:
 a charge injection sampling device for receiving an input signal,
 a transfer function generator connected to the output of said charge injection sampling device for receiving sampled signals therefrom,
 said charge injection sampling device and said transfer function generator cooperating to define a charge transfer device transversal filter,
 a frequency band selector having a first input for receiving a fixed frequency clock signal and a second input for receiving a logic signal, said frequency band selector having logic circuitry means provided therein for selecting a frequency mode from the plurality of operable frequency modes in response to the logic signal received thereby to generate clock signals corresponding to the selected frequency mode and having an output connected to said charge injection sampling device and to said transfer function generator through which the generated clock signals are transmitted, and
 continuous filter means connected to the output of said transfer function generator for providing a filtered output.

9. A programmable frequency converting filter comprising:
 a charge injection sampling device for receiving an input signal;
 a transfer function generator connected to the output of said charge injection sampling device for receiving sampled signals therefrom;
 said charge injection sampling device and said transfer function generator cooperating to define a charge transfer device transversal filter;
 a frequency band selector having a first input for receiving a fixed frequency clock signal and a second input for receiving a logic signal, said frequency band selector having logic circuitry means provided therein for receiving a logic signal which may be in either of two binary states and being responsive to said logic signal to alternately select a first frequency mode corresponding to one single side band channel when the logic signal is in a first state and a second frequency mode corresponding to one double side band channel when the logic signal is in a second state for generating clock signals having a frequency corresponding to the selected frequency mode, said logic circuitry means having an output clock lead connected to said charge injection sampling device and to said transfer function generator through which the generated clock signals of a frequency unique to the selected mode are transmitted;
 said transfer function generator of said charge transfer device transversal filter having an output providing a plurality of passbands with each passband of said plurality of passbands having a width proportional to the frequency of said clock signals generated by said logic circuitry means; and
 a continuous filter means connected to the output of said transfer function generator and having a single passband centered to transmit only one passband of the plurality of passbands provided from the output of said transfer function generator for providing a filtered output.

10. A programmable frequency converting filter according to claim 9, wherein each of the plurality of passbands provided by the output of said transfer function generator has a width $\Delta f$ when said first frequency mode corresponding to said single side band channel is selected by said logic circuitry means of said frequency band selector, and each passband has a width $2\Delta f$ when said second frequency mode corresponding to said double side band channel is selected.

11. A programmable frequency converting filter comprising:
- means for receiving electrical input signals and for generating samples of said input signals at a selectable sampling rate;
- means for logically selecting said selectable sampling rate;
- means for receiving said samples and for generating signals containing a plurality of frequency spectrums in response thereto; each spectrum of said plurality being proportional to a portion of the frequency spectrum of said samples, the width of said portion being proportional to said selectable sampling rate; and
- means for receiving said signals containing said plurality of frequency spectrums and for filtering out all but one of said plurality of frequency spectrums so as to transmit output signals having only one of said frequency spectrums.

12. A programmable frequency converting filter comprising:
- means for receiving electrical input signals and for generating samples of said input signals at a selectable sampling rate;
- means for logically selecting said selectable sampling rate so as to alternatively generate first and second clock signals depending upon the selected sampling rate;
- means for receiving said input signal samples and for generating signals containing a plurality of frequency spectrums in response thereto, each spectrum of said plurality being proportional to a portion of the frequency spectrum of said samples, the width of said portion being proportional to said selectable sampling rate and respectively being one single side band channel when said first clock signal is generated by said means for logically selecting said selectable sampling rate and one double side band channel when said second clock signal is generated by said means for logically selecting said selectable sampling rate; and
- means for receiving said signals containing said plurality of frequency spectrums and for filtering out all but one of said plurality of frequency spectrums so as to transmit output signals having only one of said frequency spectrums.

* * * * *